United States Patent [19]
Dann

[11] 4,280,100
[45] Jul. 21, 1981

[54] TIME MODULATION PULSE AVERAGING DEMODULATOR

[75] Inventor: Bert H. Dann, South Pasadena, Calif.

[73] Assignee: Bell & Howell Company, Chicago, Ill.

[21] Appl. No.: 77,511

[22] Filed: Sep. 20, 1979

[51] Int. Cl.$^3$ .............. H03D 3/14; H03K 9/04; H03K 9/06; H03K 9/08
[52] U.S. Cl. .............................. 329/103; 329/107; 329/126
[58] Field of Search .................. 329/101–103, 329/107, 110, 126; 375/80, 82, 94; 455/214, 337

[56] References Cited

U.S. PATENT DOCUMENTS

| | | | |
|---|---|---|---|
| 3,040,257 | 6/1962 | White | 328/34 |
| 3,192,408 | 6/1965 | Cho | 307/261 |
| 3,225,209 | 12/1965 | Schuster | 307/80 |
| 3,307,112 | 2/1967 | Clark | 329/104 |
| 3,328,710 | 6/1967 | Baldwin | 329/103 |
| 3,388,333 | 6/1968 | Scribner | 329/104 |
| 3,426,284 | 2/1969 | Dann | 329/101 |
| 3,470,482 | 9/1969 | Kolnowski | 329/102 |
| 3,521,084 | 7/1970 | Jones | 307/232 |
| 3,783,398 | 1/1974 | Dann | 329/50 |
| 4,100,500 | 7/1978 | Ohsawa et al. | 329/103 |

OTHER PUBLICATIONS

RCA Linear Integrated Circuits Data Book, 1977, pp. 62–65, 136–138, 233–235.

*Primary Examiner*—Siegfried H. Grimm
*Attorney, Agent, or Firm*—Benoit Law Corp.

[57] ABSTRACT

Methods and apparatus for demodulating time modulated carriers employ four matched transistors grouped in two comparator pairs. A single constant current source is provided for all four transistors. Emitters of the four transistors are metallically interconnected with each other and with an output of the single constant current source, whereby one of the transistors switches off the other transistors without the use of a capacitive element between transistor pairs. A common threshold reference voltage is applied to one transistor in one comparator pair and to one transistor in the other comparator pair. First and second repetitive pulses, preferably in the form of negative-going ramps, are generated in response to alternate successive zero crossings of the time modulated carrier. The other transistor in the one comparator pair is controlled with the first pulses and the other transistor in the other comparator pair with the second pulses to generate a train of constant area pulses corresponding to zero crossings of the time modulated carrier. The information in the modulated carrier is reproduced by averaging constant area pulses in that train.

11 Claims, 2 Drawing Figures

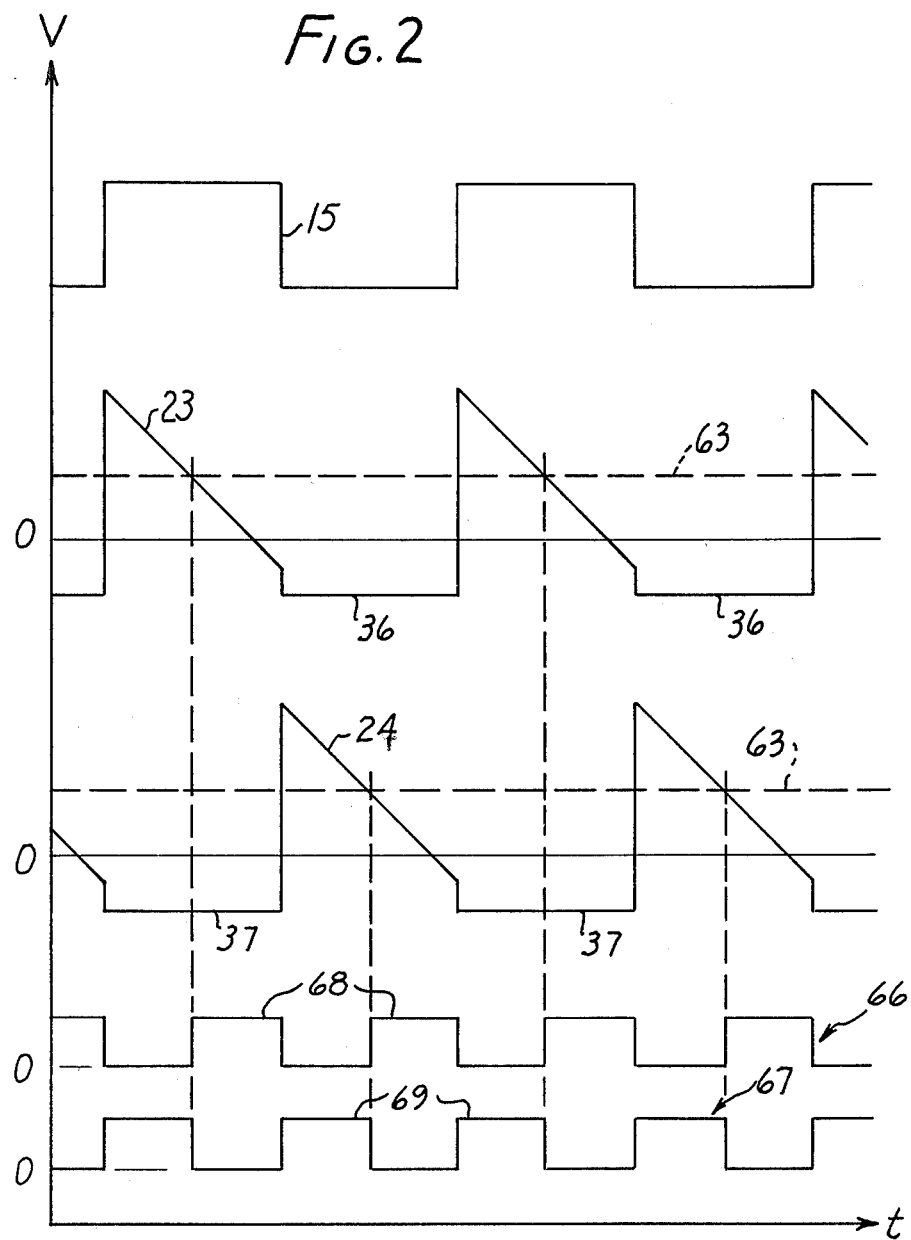

TIME MODULATION PULSE AVERAGING DEMODULATOR

BACKGROUND OF THE INVENTION

1. Field of the Invention

The subject invention relates to the demodulation of time modulated signals and, more specifically, to pulse averaging demodulators for FM and other time modulated carriers.

2. Disclosure Statement

This disclosure statement is made pursuant to the duty of disclosure imposed by law and formulated in 37 CFR 1.56(a). No representation is hereby made that information thus disclosed in fact constitutes prior art inasmuch as 37 CFR 1.56(a) relies on a materiality concept which depends on uncertain and inevitably subjective elements of substantial likelihood and reasonableness, and inasmuch as a growing attitude appears to require citation of material which might lead to a discovery of pertinent material though not necessarily being of itself pertinent.

By way of background, reference may be had to my two prior U.S. Pat. Nos. 3,426,284, issued Feb. 4, 1969, and 3,783,398, issued Jan. 1, 1974, and herewith incorporated by reference herein. Both of these patents show pulse averaging demodulators for time modulated signals, employing four transistors grouped in two comparator pairs. A common threshold reference voltage is applied to one transistor in one comparator pair and to one transistor in the other comparator pair.

First and second repetitive pulses or ramps are generated in response to alternate successive zero crossings of the time modulated signal or carrier. The other transistor in one comparator pair is controlled with the first pulses or ramps and the other transistor in the other comparator pair with the second pulses or ramps, in an effort to generate a train of constant area pulses corresponding to zero crossings of the time modulated carrier. The information signal is reproduced by averaging constant area pulses in the latter train with the aid of suitable filters.

In the demodulator disclosed in the earlier of these patents, I employed a capacitor between the emitters of the two comparator pairs in order to cause each pulse or ramp controlled transistor, upon becoming conductive, to turn off all other transistors, whereby twice the output current variation for a given frequency change could be provided.

In practice, that approach required not only the provision and implementation of an extra capacitive component but also necessitated the use of two constant current sources or their functional equivalents.

In the system disclosed in my later patent, I no longer used the mentioned capacitor, but still provided an individual constant current source for each transistor pair. The peak-to-peak current of the square wave produced by that prior demodulator thus was equal to the current supplied or sinked by either of the two constant current sources. This compared to an average current of one and one-half the latter constant current, since there was always a conducting side among the two comparator pairs.

This yielded a maximum ratio of video signal current to standing current of only two-thirds at the demodulator output. This required a large amplification of the output signal to make up for the relatively low yield or efficiency of the demodulator. In turn, a special prefiltering stage was required to reduce ripple sufficiently to permit the requisite high output signal amplification.

This prior approach bears a certain similarity to my previous system, in which the above mentioned capacitor between comparator pairs reduced ripple problems caused by variations in collector currents of insufficiently matched transistors in the comparator circuits.

SUMMARY OF THE INVENTION

It is a general object of this invention to overcome the disadvantages and satisfy the needs expressed or implicit in the above disclosure statement or apparent from other parts hereof.

It is a related object of this invention to provide improved methods and apparatus for demodulating FM and other time modulated signals.

Other objects will become apparent in the further course of this disclosure.

The subject invention resides in methods and apparatus for demodulating, with the aid of four transistors grouped in two comparator pairs, a carrier time modulated by an information signal. The invention, more specifically resides in the improvement comprising in combination the steps of, or means for, matching all four transistors with each other at least as to base-emitter drop, providing a single constant current source for all four transistors, and metallically interconnecting emitters of the four transistors with each other and with an output of the single constant current source. A common threshold reference voltage is applied to one transistor in one comparator pair and one transistor in the other comparator pair. First and second repetitive pulses are generated in response to alternate successive zero crossings of the time modulated carrier. The other transistor in the one comparator pair is controlled with the first pulses and the other transistor in the other comparator pair with the second pulses to generate a train of constant area pulses corresponding to zero crossings of the time modulated carrier. The information signal is reproduced by averaging constant area pulses in the latter train.

Further aspects of the subject invention and preferred embodiments thereof are disclosed below.

BRIEF DESCRIPTION OF THE DRAWINGS

The subject invention will become more readily apparent from the following detailed description of preferred embodiments thereof, illustrated by way of example in the accompanying drawings, in which like reference numerals designate like or functionally equivalent parts, and in which:

FIG. 2 is a series of waveforms useful in understanding the operation of the circuit of FIG. 1.

DESCRIPTION OF PREFERRED EMBODIMENTS

Figure 1:
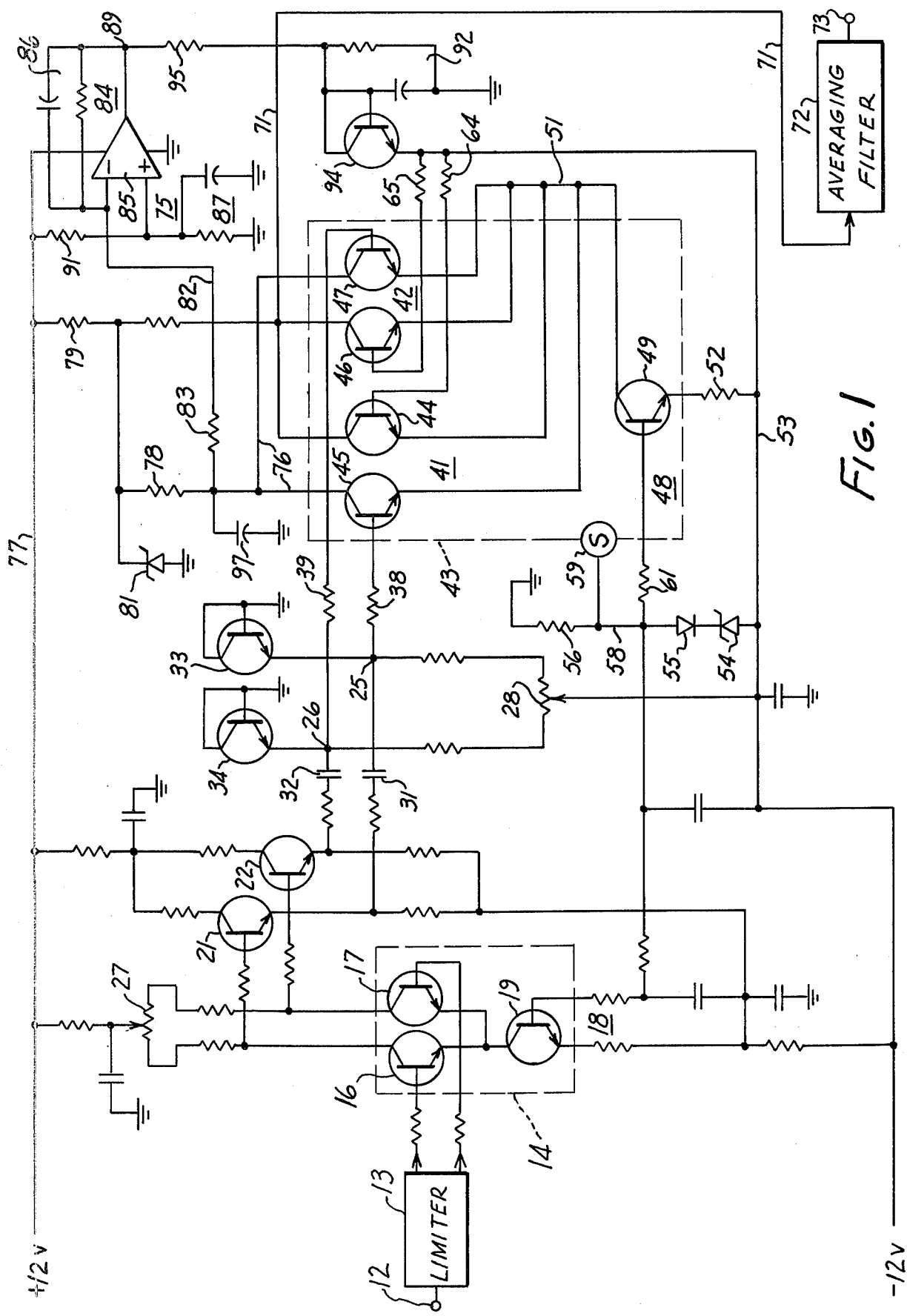
FIG. 1 is a schematic diagram of a demodulator circuit embodying the present invention in its currently perceived best mode.

The demodulator systems herein disclosed are particularly suitable for video applications, including video recording and reproduction, and to wide-band instrumentation recording and reproduction at carrier rates reaching into the 20 MHz area. A prototype of the illustrated circuit is currently operating at an average carrier frequency of 12 MHz.

By way of background, a time modulated carrier, such as obtained by reproduction of a recorded composite television or wide-band instrumentation recording, is applied to the input terminal 12 of a limiter 13.

The limiter 13, including its specifically illustrated final stage 14, provides a square-wave signal of the type shown at 15 in FIG. 2, containing the time modulated carrier.

The non-saturating limiter stage 14 includes a pair of NPN transistors 16 and 17 which receive the modulated carrier signal at their respective bases. The emitters of the transistors 16 and 17 are connected to a constant current source 18 including an NPN transistor 19 connected as shown in FIG. 1.

In particular, the collector of transistor 19 provides a constant current in the limiter stage 14.

The collectors of the limiter transistors 16 and 17 are connected to the bases of emitter follower NPN transistors 21 and 22. First and second repetitive pulses or ramps of the type shown at 23 and 24 in FIG. 2 are generated at junctions 25 and 26 in response to alternate successive zero crossings of the time modulated carrier 15.

The ramps 23 and 24 are balanced by potentiometers 27 and 28 connected as shown in FIG. 1. In particular, the potentiometer 27 permits adjustment of the initial drops of the ramps 23 and 24 to make them identical. The slope angles of alternate ramps 23 and 24 are balanced by means of potentiometer 28.

The emitters of transistors 21 and 22 are connected to the junctions 25 and 26 via charging capacitors 31 and 32. Emitters of diode-connected clamping transistors 33 and 34 are connected to the junctions 25 and 26. The NPN transistors 33 and 34 function as base clamps manifesting themselves in the lower voltage levels 36 and 37 shown in FIG. 2.

By way of example, the limiter stage 14 with constant current source may include an integrated circuit of the type CA3049T as shown, for instance, on pages 136 to 138 of the RCA Linear Integrated Circuits Data Book (1977).

Junctions 25 and 26 are connected via parasitic-suppression resistors 38 and 39 to respective base inputs of differential comparator and clipper pairs 41 and 42. In particular, a comparator and clipper component 43 includes four NPN transistors 44, 45, 46 and 47 grouped into the two comparator pairs 41 and 42. According to an aspect of the subject invention, all four transistors 44 to 47 are matched with each other at least as to base-emitter drop. To this end, the currently discussed aspect of the invention takes advantage of the availability of four or more matched gigahertz transistors on a single chip.

By way of example, the demodulator component 43 may be an integrated circuit of the type CA3127E as shown, for instance, on pages 233 to 235 of the above mentioned RCA Data Book.

According to another aspect of the subject invention, a single constant current source 48 is provided for all four transistors 44 to 47. This constant current source includes an NPN transistor 49 which advantageously may be the fifth matched transistor in the above mentioned type CA3127E or in an equivalent integrated circuit.

According to a further aspect of the subject invention, the emitters of all four transistors 44 to 47 are metallically interconnected with each other and with an output of the constant current source 48 or collector of the source transistor 49. One or more metallic conductors 51 may serve as the means for metallically interconnecting the emitters of the transistors 44 to 47 and the output of the single constant current source 48. In this respect, the expression "metallically interconnecting," is used in the dictionary senses denoting, or having the nature of, metal or being like or characteristic of metal. In contradistinction to prior circuits of the above mentioned type, the expression "metallically interconnecting" or "metallic interconnection" denotes an interconnection free of capacitive connecting elements. In contrast to an alternating-current connection, the interconnection 51 is of the direct-current connection type, which has sometimes also been referred to as "galvanic connection."

The metallic interconnection 51 according to an aspect of the subject invention dispenses with the above mentioned capacitive connecting element of my prior demodulator disclosed in U.S. Pat. No. 3,426,284 and with the dual constant current sources or high value resistors of my prior circuits disclosed in the latter patent and also in U.S. Pat. No. 3,783,398.

The single constant current source 48 for the comparator pairs 41 and 42 includes a resistor 52 connected between the emitter of transistor 49 and a negative power supply lead 53. The source 48 further includes a zener diode 54, temperature compensation diode 55 and resistor 56 connected in series between the negative supply lead 53 and ground. The junction 58 between the diode 55 and resistor 56 is connected to the substrate 59 of the integrated circuit 43 and, via a resistor 61, to the base of the source transistor 49.

A common threshold reference voltage symbolized in FIG. 2 by dotted lines 63 is applied via parasitic-suppression resistors 64 and 65 to bases of one transistor 44 in one comparator pair 41 and one transistor 46 in the other comparator pair 42. The other transistor 45 in the comparator pair 41 is controlled with the first pulses or ramps 23 and the other transistor 47 in the other comparator pair 42 is controlled with the second pulses or ramps 24 to generate a train 66 or 67 of constant area pulses 68 or 69, as shown in FIG. 2.

Unlike my prior demodulator disclosed in the above mentioned U.S. Pat. No. 3,783,398, which employs positive-going ramps, the preferred embodiment of the subject invention shown in FIG. 1 provides with the aid of NPN transistors 21 and 22 first and second negative-going ramps 23 and 24 in response to alternate successive zero crossings of the time modulated carrier 15, and controls the mentioned other transistor 45 in the one comparator pair 41 with these first negative-going ramps 23 and the other transistor 47 in the other comparator pair 42 with the second negative-going ramps 24 to generate the train of constant area pulses 68 and/or 69, as shown in FIG. 2, with the aid of the single constant current source 48 for all four transistors 44 to 47, and with the aid of the metallic interconnection 51 of the output of the constant current source 48 and the emitters of all four transistors.

The pulse train 66 in FIG. 2 represents the switched collector currents of the inside transistors 44 and 46, and the pulse train 67 the switched collector currents of the outside transistors 45 and 47. In practice, either or both of these pulse trains may be employed to provide the demodulator output. In the embodiment shown in FIG. 1, the pulse train 66 is applied via a lead 71 as the output of the comparator clipper component 43.

As a special feature of the subject invention, if one of the transistors 45 or 47 goes on, all four emitters are pulled positive via the metallic common interconnection 51, whereby the remaining three transistors are necessarily turned off.

When the base of either transistor 45 and 47 is more positive than or goes above the threshold reference voltage 63, the remaining three transistors 44, 46 and 47, or 44, 45 and 46 are cut off via the metallic interconnection 51. Similarly, if neither transistor 45 nor transistor 47 conducts, then the entire output of the current source 48 must flow through inside transistors 44 and 46.

The output of the demodulator component 43 thus sharply oscillates between a current equal to the output of the constant current source 48 and zero, relative to a standing current of approximately one-half the constant current source output; with "output" being conceived sufficiently broadly to cover also current sinking, if the source 48 operates in effect as a current sink rather than a current source in the traditional sense.

The above mentioned ratio of peak-to-peak current to standing current is approximately equal to 2 in the case of demodulators according to the subject invention. This represents a three times improvement over the prior two-thirds ratio mentioned above.

In practice, this enables me to go directly to the final baseband or averaging filter 72 without prefiltering and preamplification.

In terms of FIG. 1, the output 71 or pulse train 66 is processed through the filter 72 to reproduce the information signal at an output 73 by averaging the constant current pulses 68 in the train 66.

As may be visualized from FIG. 2, variations in the threshold reference voltage 63 manifest themselves in variations of the width of the pulses 68 and 69 and thus fluctuations of the duty cycle corresponding to the average carrier rate and demodulator gain.

In practice, such fluctuations may arise out of the failure of the diode clamping voltages to track the base-emitter voltages of the comparators with temperature changes, and cause highly undesirable gain variations.

According to a further aspect thereof, the subject invention provides for a long-term constant duty cycle at average carrier rate. In the best mode presently contemplated for carrying this aspect of my invention into effect, the illustrated preferred embodiment employs means including a negative feedback loop 75 extending from the above mentioned other transistors 45 and 47 to the mentioned one transistors 44 and 46 for establishing a constant duty cycle in the train of pulses 66 and 67.

To this end, the collector current outputs 76 of the transistors 45 and 47 extend to the positive power supply lead 77 via resistors 78 and 79. The illustrated embodiment is thus capable of sensing long-term duty cycle in the comparator pairs 41 and 42, to derive a negative feedback signal from such sensed duty cycle, and to adjust the threshold reference voltage 63 with that negative feedback signal to establish a constant duty cycle in the train of pulses 66.

In the illustrated preferred embodiment, a grounded zener diode 81 is connected to the junction between resistors 78 and 79. The function of the zener diode is to provide decoupling of any spurious signals on the +12 volt supply rail from the filter-system input, and it is not an essential part of the control loop.

A lead 82 derives from the resistor 78 via a resistor 83 a signal indicative of the switched collector current pulses 69 or output pulse train 67 of the outer transistors 45 and 47.

In the illustrated embodiment, the pulse train 67 is then averaged in an integrating circuit 84, including an operational amplifier 85 and R/C components 86 and 87. By way of example, the operational amplifier 85 may be of the type CA741HM, as shown, for instance, on pages 62 to 65 of the above mentioned Data Book.

The lead 82 is connected to the inverting input of the operational amplifier 85. The R/C component 86 extends in a feedback path between the output 89 and the inverting input of the operational amplifier 85. The R/C component 87 and a resistor 91 are connected in series between ground and the positive power supply lead 77. A junction between the R/C component 87 and the resistor 91 is connected to the non-inverting input of the operational amplifier 85. A further integrating or R/C component 92 is connected between the amplifier output 89 and ground.

A temperature compensating NPN transistor 94 is connected via a resistor 95 to the amplifier output 89, in order to apply the averaged train of constant amplitude pulses derived from the resistor 78, via parasitic-suppression resistors 64 and 65 to the bases of the above mentioned one transistors 44 and 46. The circuit 75 shown in FIG. 1 thus employs the derived negative feedback signal to establish a constant duty cycle in the train of pulses 66. The common threshold reference voltage 63 is thus advantageously locked to a predetermined level, whereby detrimental fluctuations in the demodulated information or baseband signal are reliably avoided.

According to a further feature of the illustrated preferred embodiment, the collectors or outputs 76 of the transistors 45 and 47 are operated at alternating-current ground via a capacitor 97 to avoid Miller feedback effects from the load of the demodulator.

The subject invention thus meets all its objectives and provides wide-band demodulators and demodulating techniques that are clearly superior to those of the prior art.

The subject extensive disclosure will suggest and render apparent to those skilled in the art various modifications and variations within the spirit and scope of the subject invention.

I claim:

1. In a method of demodulating, with the aid of four transistors grouped in two comparator pairs, a carrier time modulated by an information signal, the improvement comprising in combination the steps of:
matching all four transistors with each other at least as to base-emitter drop;
providing a single constant current source for all four transistors;
metallically interconnecting emitters of said four transistors with each other and with an output of said single constant current source;
applying a common threshold reference voltage to one transistor in one comparator pair and one transistor in the other comparator pair;
generating first and second repetitive pulses in response to alternate successive zero crossings of said time modulated carrier;
controlling the other transistor in said one comparator pair with said first pulses and the other transistor in said other comparator pair with said second pulses to generate a train of constant area pulses corresponding to zero crossings of said time modulated carrier; and reproducing said information signal by averaging constant area pulses in said train.

2. A method as claimed in claim 1, wherein:

said generation of pulses includes the step of generating first and second repetitive ramps in response to alternate successive zero crossings of said time modulated carrier; and said control of the other transistors includes the steps of controlling the other transistor in said one comparator pair with said first ramps and the other transistor in said other comparator pair with said second ramps to generate said train of constant area pulses.

3. A method as claimed in claim 1, wherein:

said generation of pulses includes the step of generating first and second repetitive negative-going ramps in response to alternate successive zero crossings of said time modulated carrier; and said control of the other transistors includes the steps of controlling the other transistor in said one comparator pair with said first negative-going ramps and the other transistor in said other comparator pair with said second negative-going ramps to generate said train of constant area pulses.

4. A method as claimed in claim 1, 2 or 3, including the steps of:

sensing long-term duty cycle in said comparator pairs;

deriving a negative feedback signal from said sensed duty cycle; and adjusting said threshold reference voltage with said negative feedback signal to establish a constant long-term duty cycle in said train of pulses.

5. A method as claimed in claim 1, 2 or 3, including the steps of:

sensing long-term duty cycle of current flow in said other transistors;

deriving a negative feedback signal from said sensed duty cycle; and controlling said one transistors with said negative feedback signal to establish a constant long-term duty cycle in said train of pulses.

6. In apparatus for demodulating, with the aid of four transistors grouped in two comparator pairs, a carrier time modulated by an information signal, the improvement comprising in combination:

means for providing all four transistors with matched characteristics including at least matched base-emitter drops;

a single constant current source for all four transistors;

means for metallically interconnecting emitters of said four transistors with each other and with an output of said single constant current source;

means for applying a common threshold reference voltage to one transistor in one comparator pair and one transistor in the other comparator pair;

means for generating first and second repetitive pulses in response to alternate successive zero crossings of said time modulated carrier;

means for controlling the other transistor in said one comparator pair with said first pulses and the other transistor in said other comparator pair with said second pulses to generate a train of constant area pulses corresponding to zero crossings of said time modulated carrier; and means connected to said comparator pairs for reproducing said information signal by averaging constant area pulses in said train.

7. Apparatus as claimed in claim 6, wherein:

said generating means include means for generating first and second repetitive ramps in response to alternate successive zero crossings of said time modulated carrier; and said control means include means for controlling the other transistor in said one comparator pair with said first ramps and the other transistor in said other comparator pair with said second ramps to generate said train of constant area pulses.

8. Apparatus as claimed in claim 6, wherein:

said generating means include means for generating first and second repetitive negative-going ramps in response to alternate successive zero crossings of said time modulated carrier; and said control means include means for controlling the other transistor in said one comparator pair with said first negative-going ramps and the other transistor in said other comparator pair with said second negative-going ramps to generate said train of constant area pulses.

9. Apparatus as claimed in claim 6, 7 or 8, including:

means connected to said comparator pairs for sensing long-term duty cycle in said comparator pairs;

means connected to said sensing means for deriving a negative feedback signal from said sensed duty cycle; and means connected to said deriving means and to said reference voltage applying means for adjusting said threshold reference voltage with said negative feedback signal to establish a constant long-term duty cycle in said train of pulses.

10. Apparatus as claimed in claim 6, 7 or 8, including:

means connected to said other transistors for sensing long-term duty cycle of current flow in said other transistors;

means connected to said sensing means for deriving a negative feedback signal from said sensed duty cycle; and means connected to said deriving means and to said reference voltage applying means for controlling said one transistors with said negative feedback signal to establish a constant long-term duty cycle in said train of pulses.

11. Apparatus as claimed in claim 6, 7 or 8, including:

means including a negative feedback loop extending from said other transistors to said one transistors for establishing a constant long-term duty cycle in said train of pulses.

* * * * *